(12) United States Patent
Erikson et al.

(10) Patent No.: US 6,716,669 B2
(45) Date of Patent: Apr. 6, 2004

(54) HIGH-DENSITY INTERCONNECTION OF TEMPERATURE SENSITIVE ELECTRONIC DEVICES

(75) Inventors: Kenneth R. Erikson, Henniker, NH (US); John W. Marciniec, Framingham, MA (US)

(73) Assignee: Bae Systems Information and Electronic Systems Integration Inc, Nashua, NH (US)

( * ) Notice: Subject to any disclaimer, the term of this patent is extended or adjusted under 35 U.S.C. 154(b) by 0 days.

(21) Appl. No.: 10/284,999

(22) Filed: Oct. 31, 2002

(65) Prior Publication Data

US 2004/0023433 A1 Feb. 5, 2004

Related U.S. Application Data

(60) Provisional application No. 60/401,017, filed on Aug. 2, 2002.

(51) Int. Cl.⁷ .................. H01L 21/44; H01L 21/48; H01L 21/50
(52) U.S. Cl. ...................................... 438/106; 438/612
(58) Field of Search .................. 438/26, 55, 64, 438/106, 107, 108, 612, 613, 618

(56) References Cited

U.S. PATENT DOCUMENTS

| 4,950,623 | A |  | 8/1990 | Dishon |
| 5,145,104 | A | * | 9/1992 | Apap et al. .................. 228/179 |
| 5,381,946 | A |  | 1/1995 | Koopman et al. |
| 6,071,670 | A | * | 6/2000 | Ushirogouchi et al. .. 430/270.1 |
| 6,140,435 | A |  | 10/2000 | Zanotti-Russo |
| 6,268,114 | B1 |  | 7/2001 | Wen et al. |
| 6,300,250 | B1 |  | 10/2001 | Tsai |
| 6,387,793 | B1 |  | 5/2002 | Yap et al. |
| 6,426,556 | B1 |  | 7/2002 | Lin |

OTHER PUBLICATIONS

PCT International Search Report dated Apr. 15, 2003 of International Application No. PCT/US02/34948 filed Oct. 31, 2002.

* cited by examiner

*Primary Examiner*—David Nhu
(74) *Attorney, Agent, or Firm*—Maine & Asmus

(57) ABSTRACT

Techniques for interconnecting high-density, structures that include temperature sensitive materials such as piezoelectric ultrasonic transducer arrays, optical detector arrays, MEMS and the like to other structures (e.g., integrated circuits or mechanical assemblies) are disclosed.

23 Claims, 12 Drawing Sheets

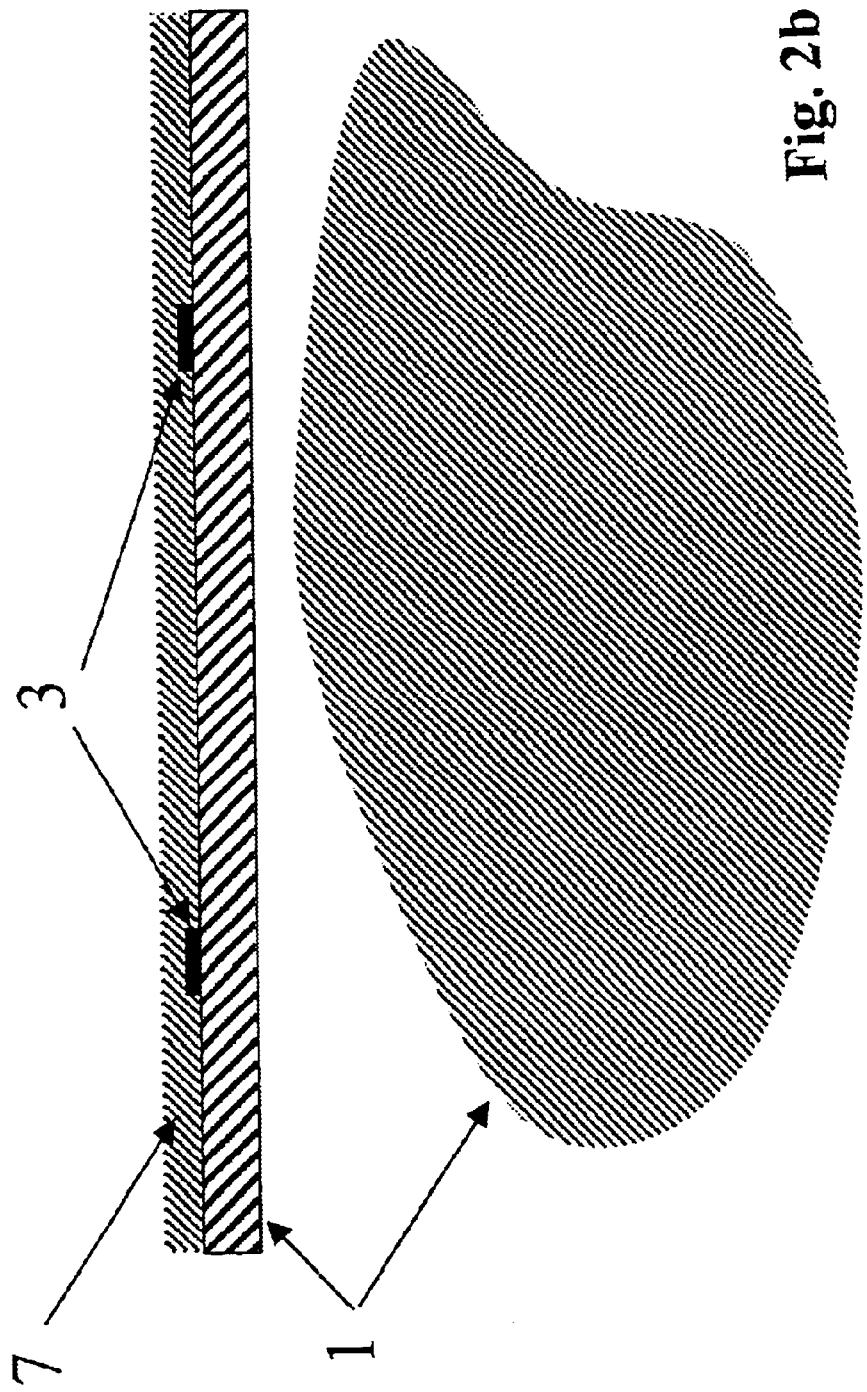

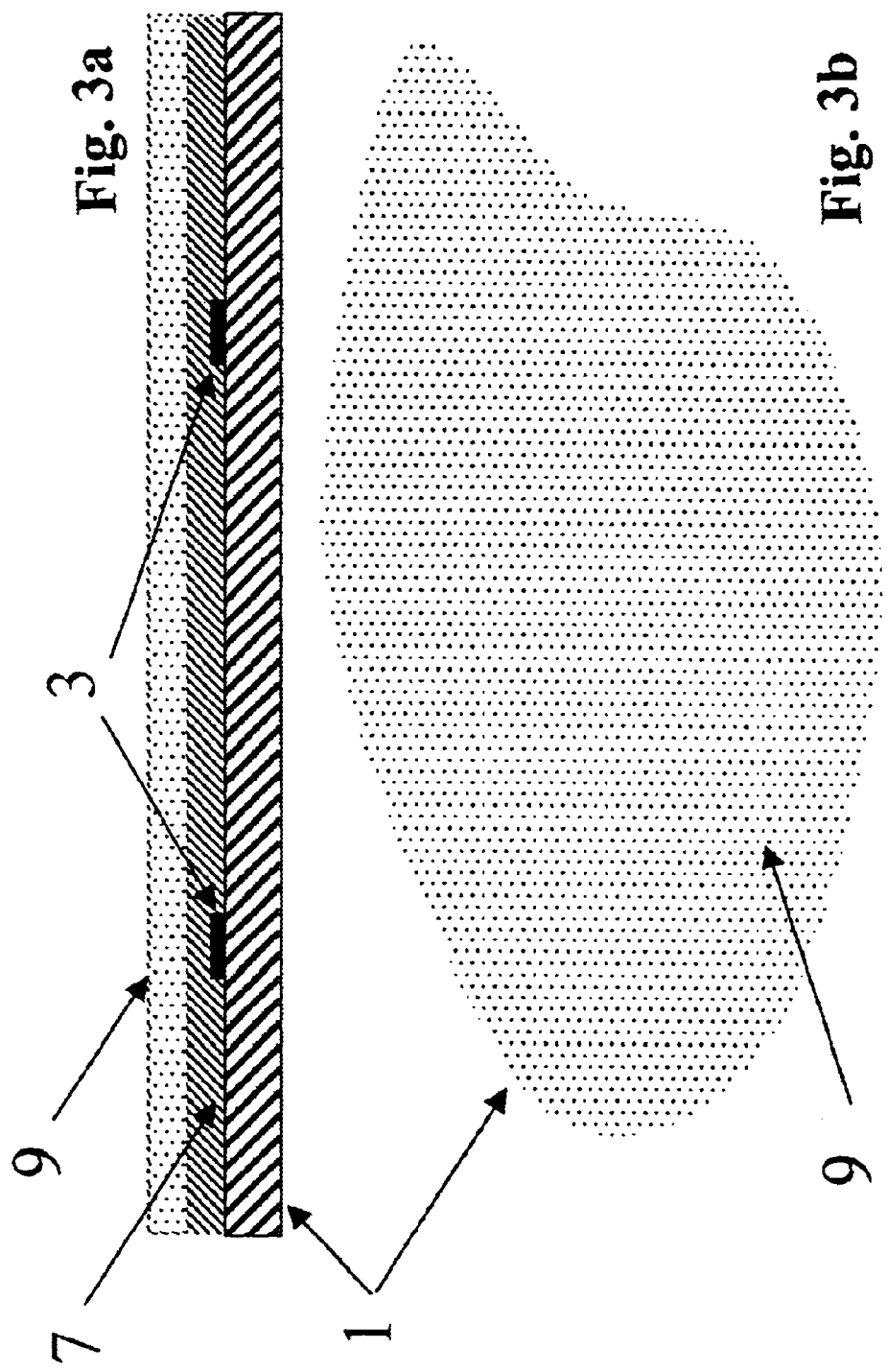

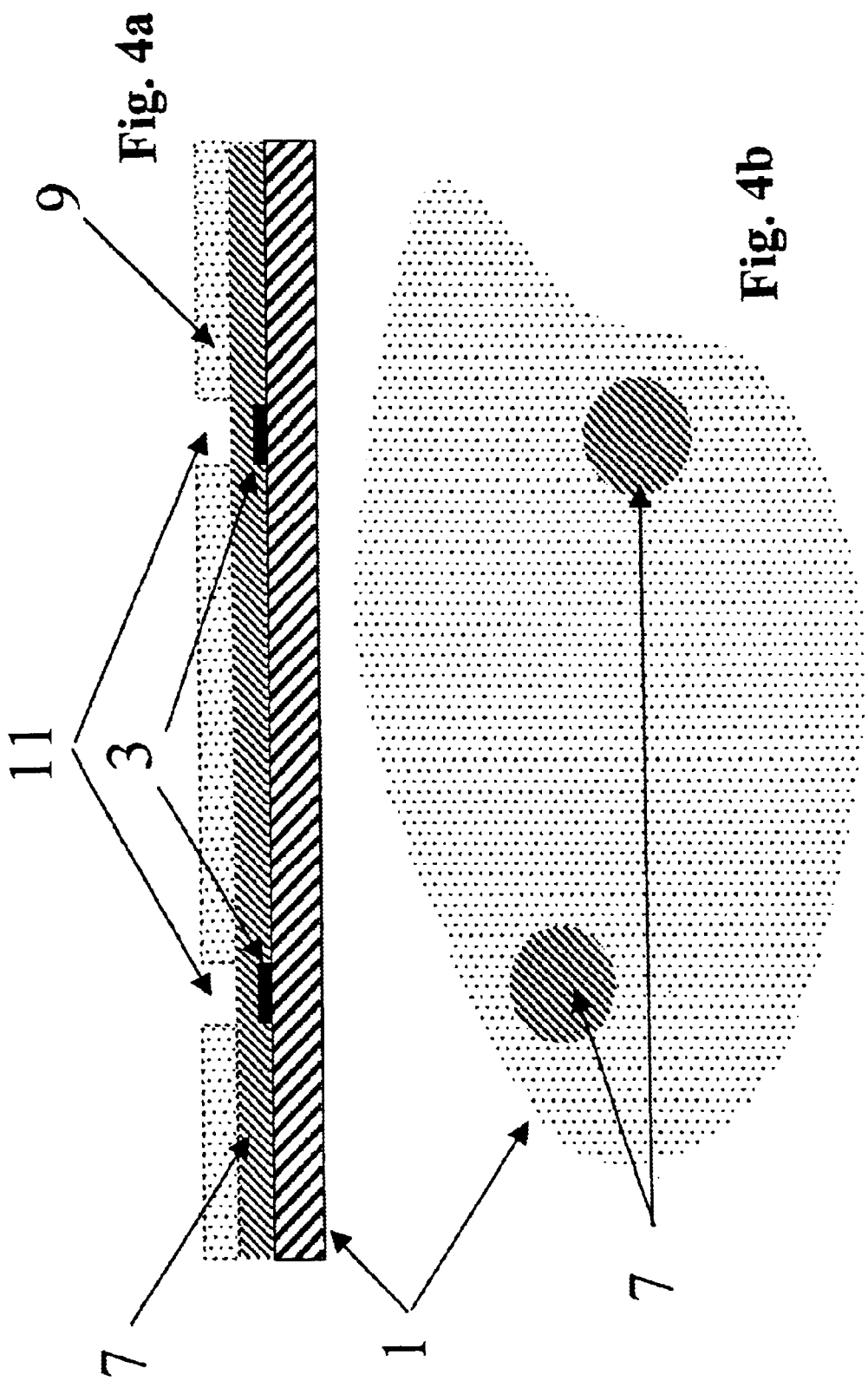

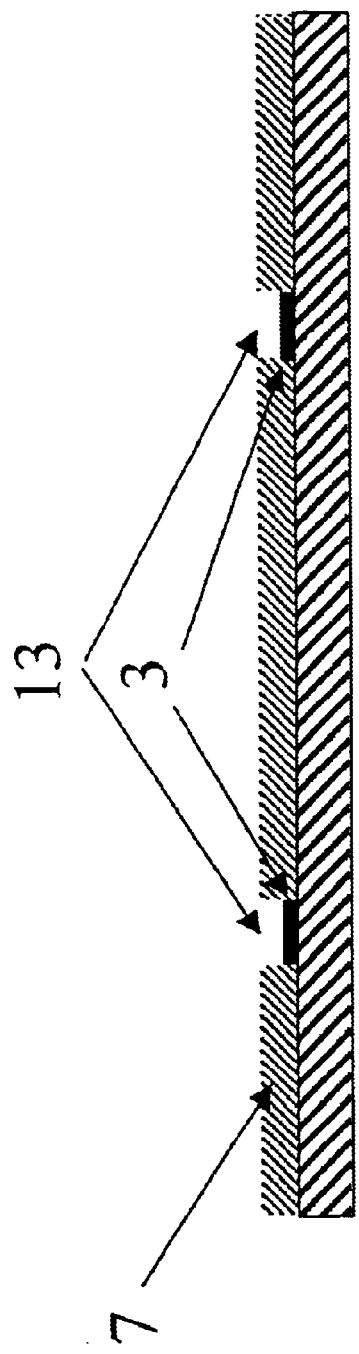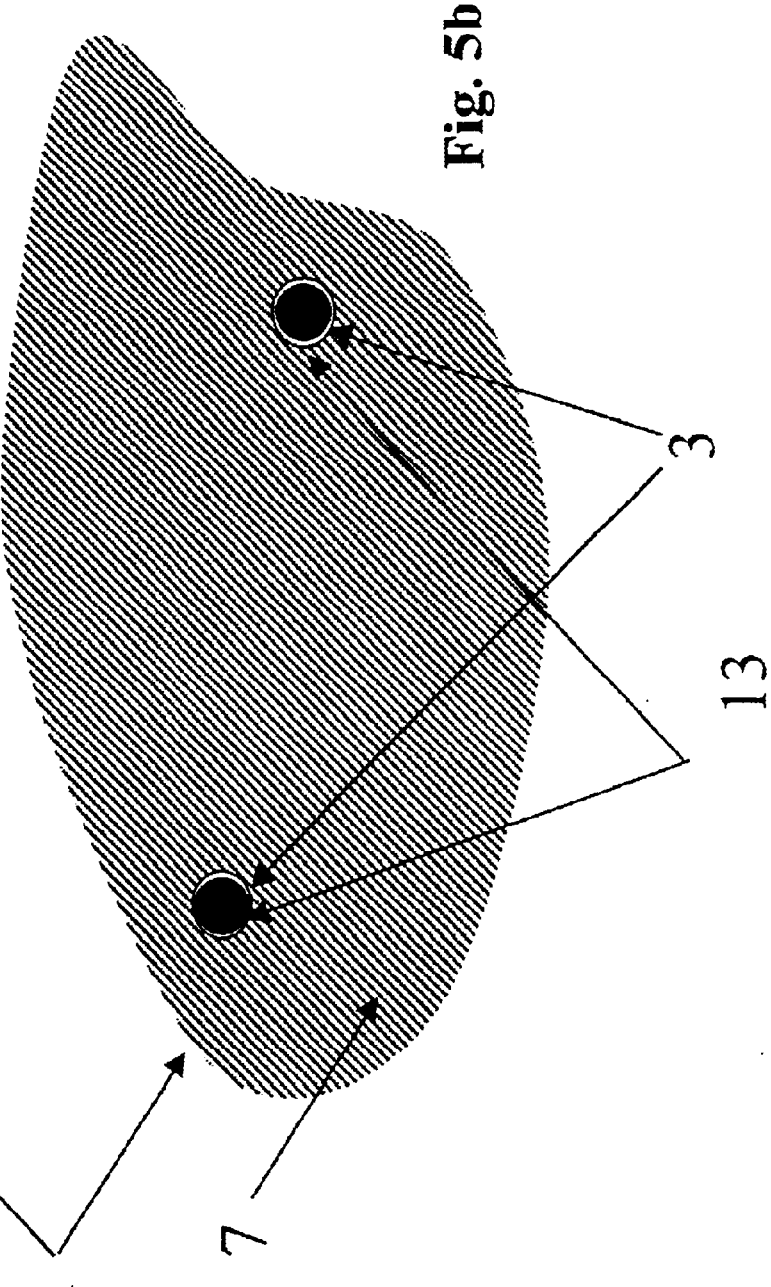

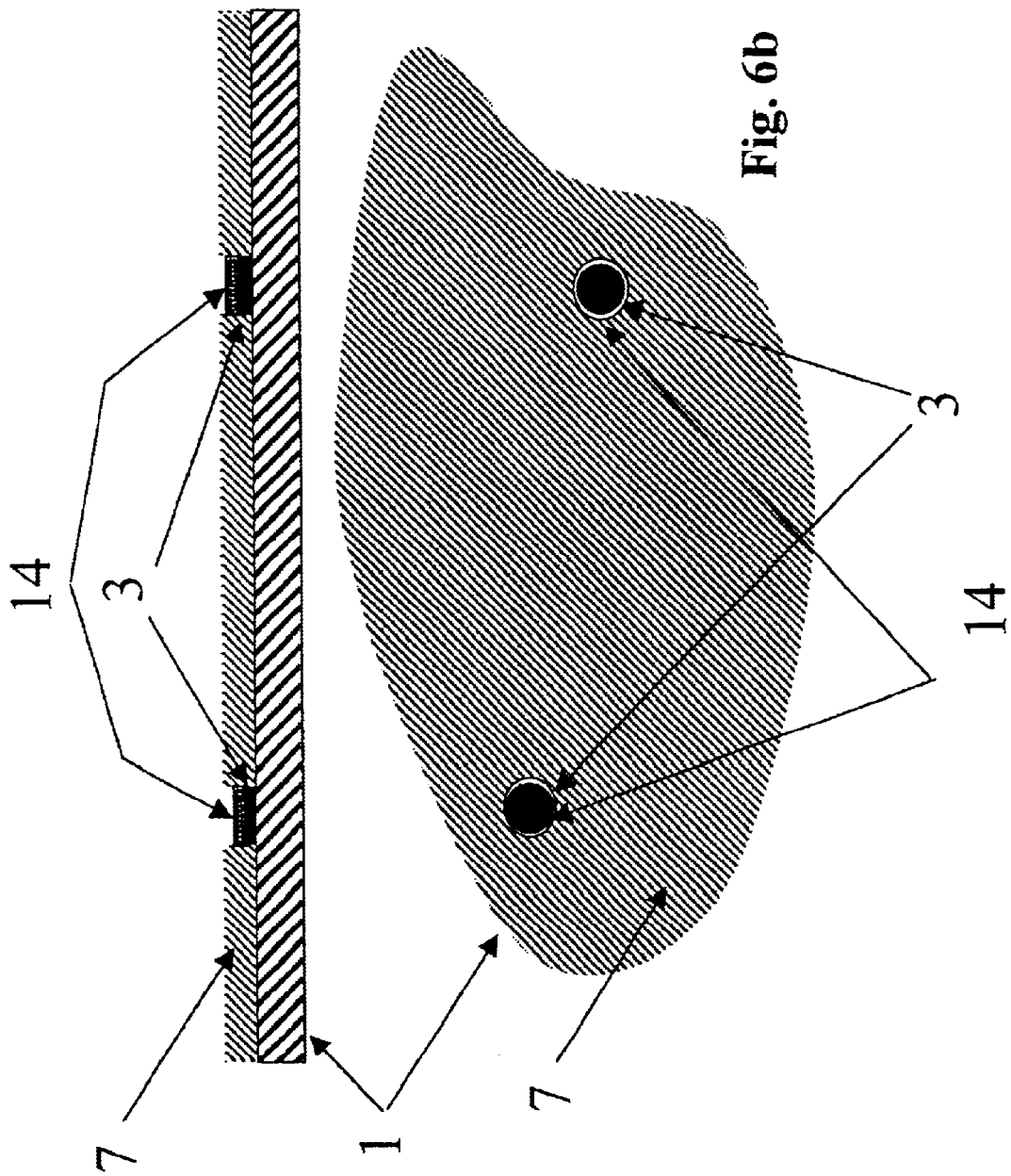

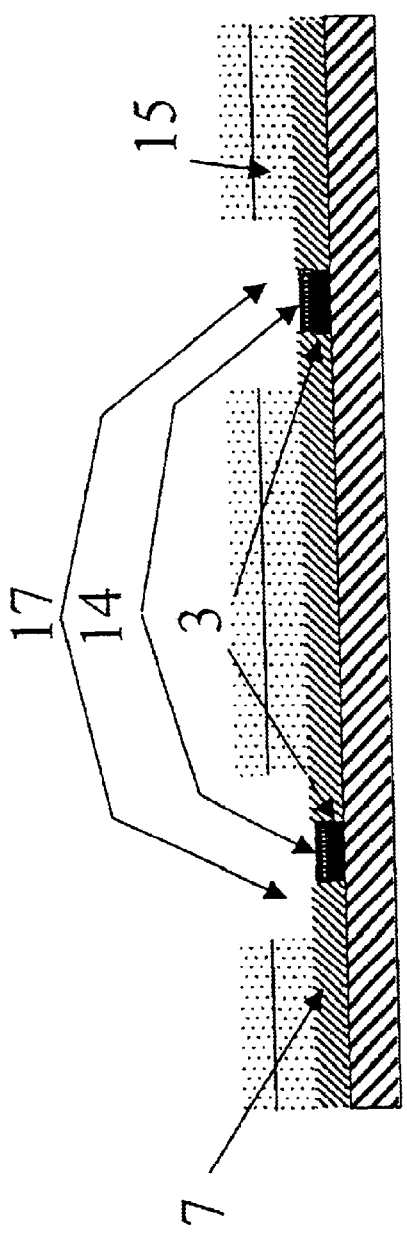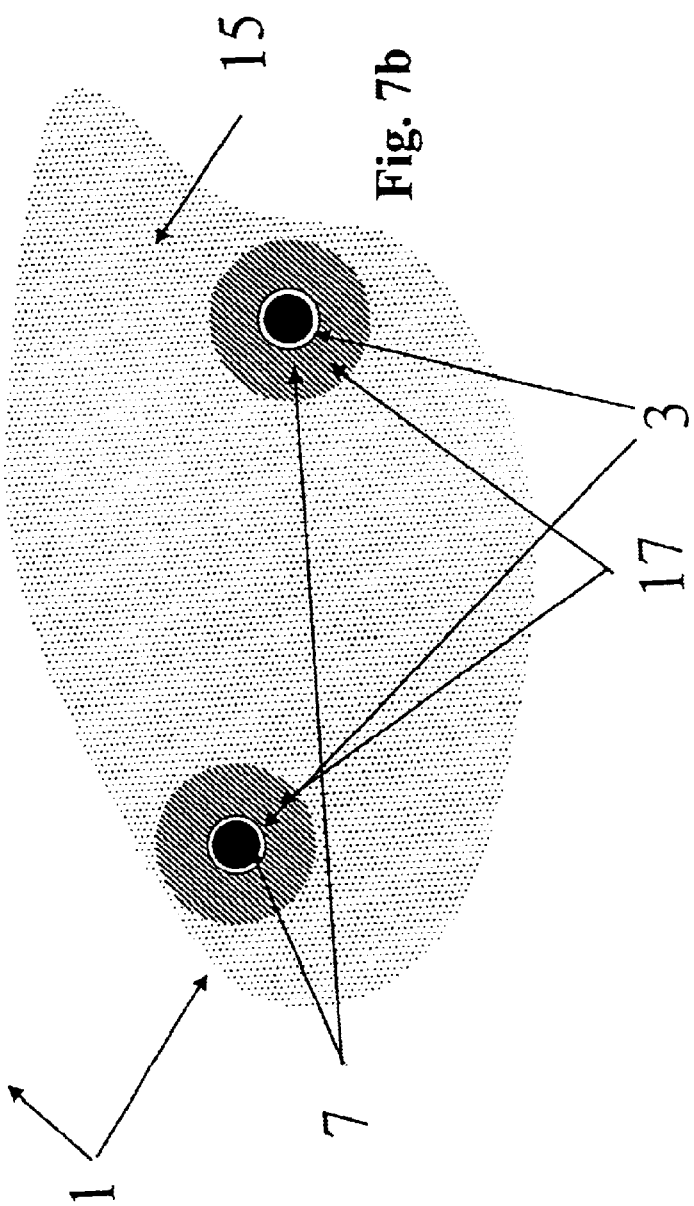

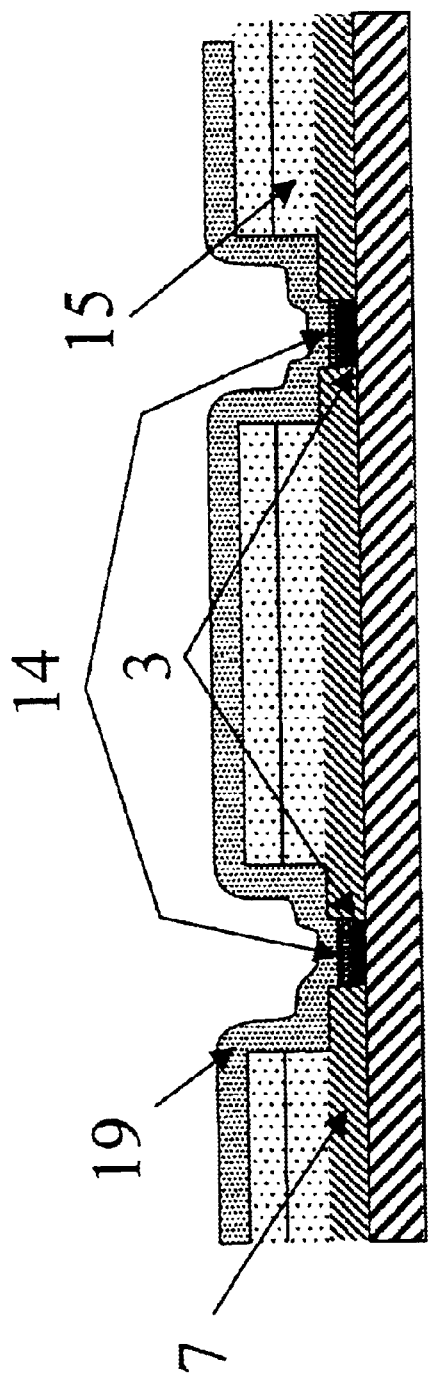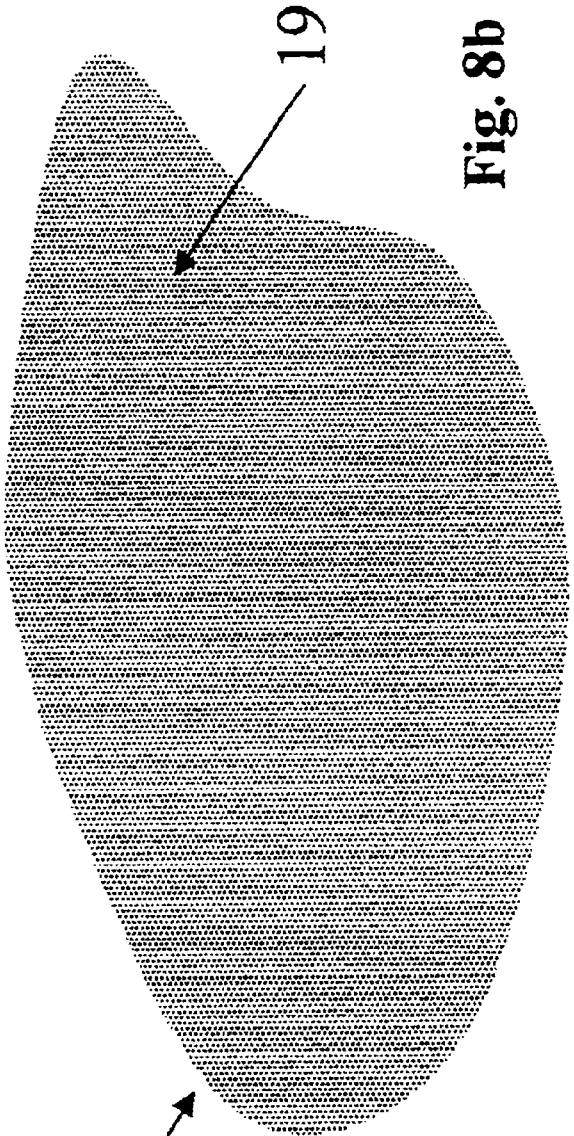

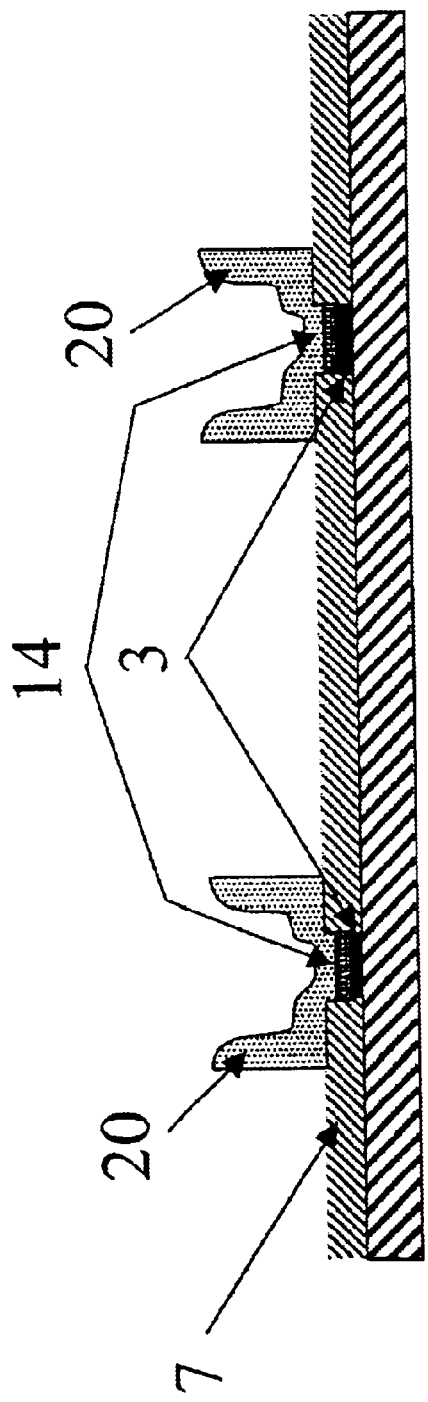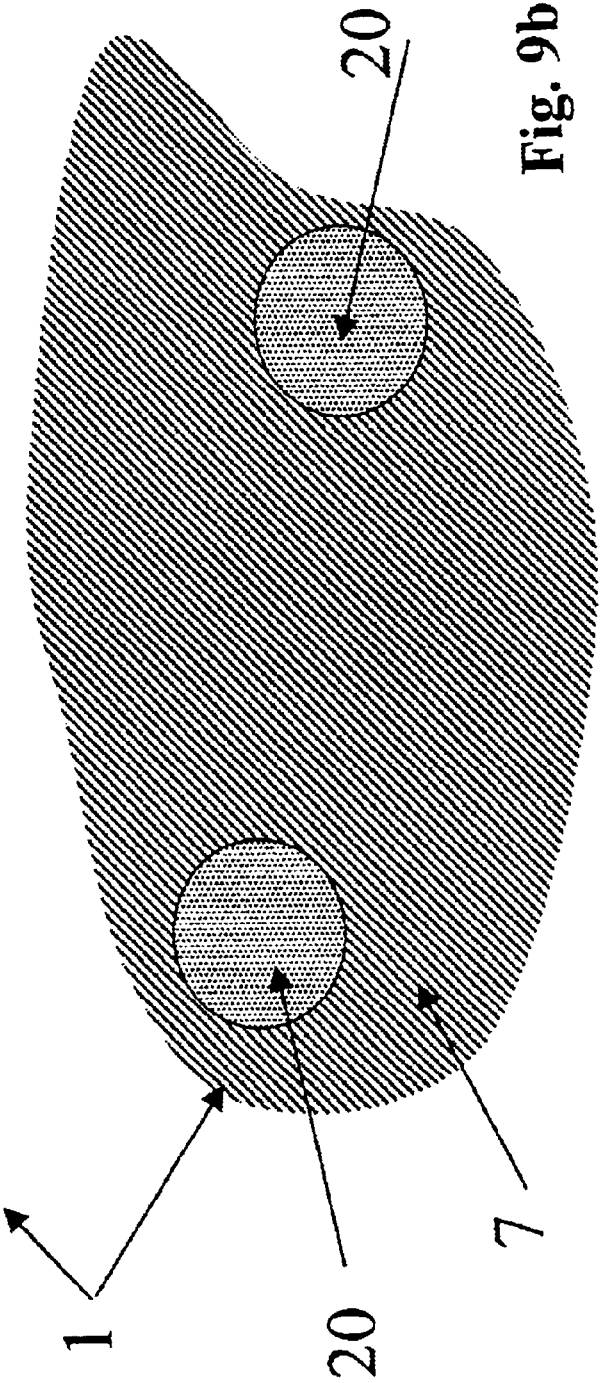

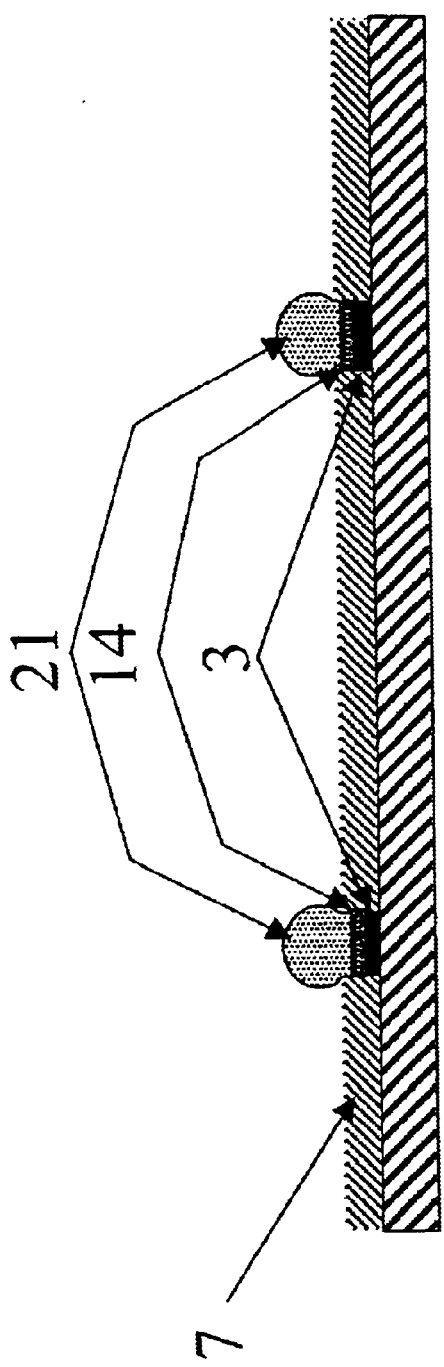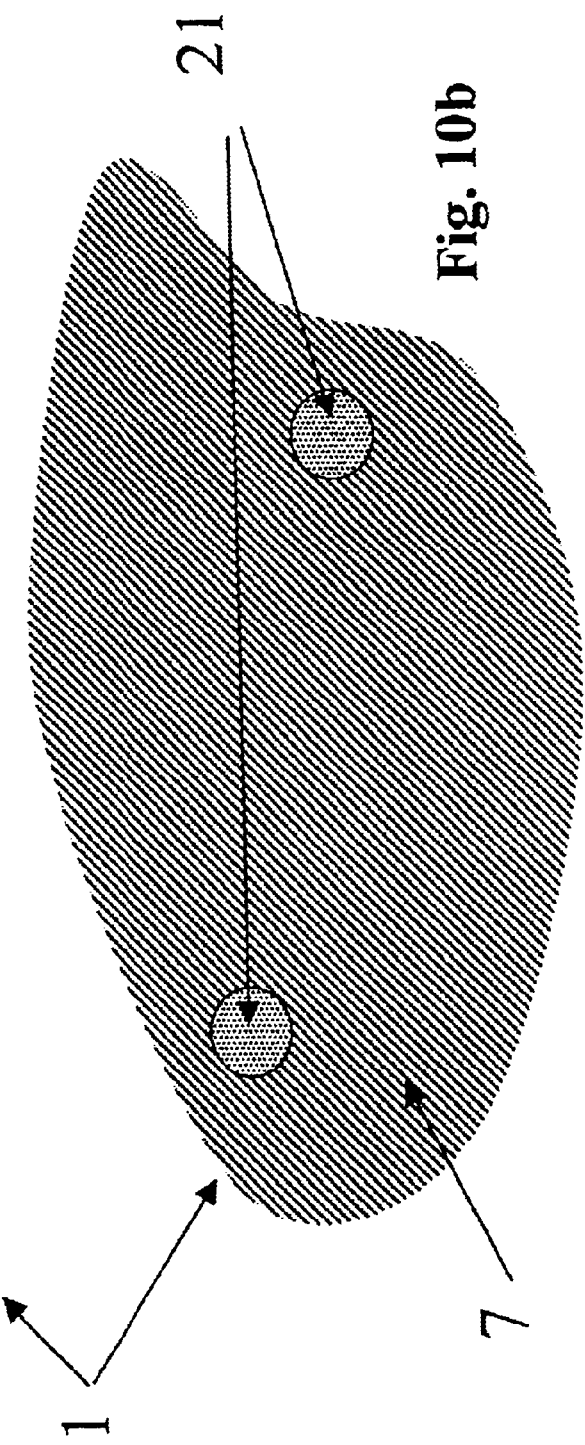

HIGH-DENSITY INTERCONNECTION OF TEMPERATURE SENSITIVE ELECTRONIC DEVICES

RELATED APPLICATIONS

This application claims the benefit of U.S. Provisional Application No. 60/401,017, filed Aug. 2, 2002, which is herein incorporated in its entirety by reference.

FIELD OF THE INVENTION

The invention relates to integrated circuits, and more particularly, to high-density interconnection of temperature sensitive devices to integrated circuits.

BACKGROUND OF THE INVENTION

The semiconductor industry continues to move to smaller, denser integrated circuits (IC's) with greatly increased capabilities. The "system-on-a-chip" has become a reality in recent years. In parallel with this trend to higher densities have been advances in integrated circuit packaging, enabling larger numbers of input/output connections to external circuitry in smaller areas. Integrated circuit packages such as the ball-grid array (BGA), Chip-scale package (CSP), and the C4 package (Flip-Chip) are examples of such packaging.

Along with these advances, new methods for interconnecting the IC packages to external printed circuit boards have also been developed. Flip-chip bonding has become an industry standard for high-density interconnections, and permits several hundred or more interconnections to be made simultaneously, and is often referred to as a mass-interconnection method. As the electronics industry continues to evolve, however, techniques for achieving greater numbers of interconnections and higher densities will be highly desirable.

Furthermore, many systems-on-a-chip being developed employ temperature sensitive devices or materials, such as plastics, piezoelectric ceramics, or organic molecular sensors. Other such temperature sensitive materials and devices will be apparent to those skilled in the art. These devices can be included on the chip itself, or can be "bump bonded" to the chip as a hybrid structure.

Temperature limitations associated with such devices preclude the use of conventional fabrication processes operating at relatively high temperatures. For example, lead-tin (PbSn) solder, used in numerous processes, has a melting point greater than 300° C. Once heated above its temperature limits, a device may exhibit degraded performance or otherwise cease to function. Such damage is typically not reversible. The interconnections of such devices must therefore be fabricated with consideration given to temperature limitations.

For example, the interconnections of some infrared detector arrays are made with evaporated pure Indium solder, where solder "bumps" are patterned using photolithography, and the interconnections are made by cold welding the detector array to the IC. However, in other applications (e.g., such as ultrasound arrays), the Indium cold-welding approach is not adapted from the infrared applications is not reliable. Other conventional methods for bump bonding temperature sensitive devices include the use of polymer "solders," solder jetting, evaporation, stencil printing, solder extrusion, solder casting, electroless deposition, electroplating, sputtering, and flip-chip reflow techniques. Each of these conventional methods is associated with problems.

What is needed, therefore, are improved techniques for performing high-density mass-interconnection of temperature sensitive electronic devices.

BRIEF SUMMARY OF THE INVENTION

One embodiment of the present invention provides a method for interconnecting a first structure (e.g., such as a piezoelectric ultrasonic transducer array) to a second structure (e.g., integrated circuit or assembly). The first structure has a number of layers or regions including a photosensitive polymer layer, a mask layer, electrical contacts which are accessible via holes in the mask layer, and a temperature sensitive material that has an upper temperature limit. The method includes etching the photosensitive polymer layer thereby opening a set of holes in the photosensitive polymer layer. Each of these opened holes is located over an electrical contact, and is generally wider than the corresponding hole in the mask layer.

The method further includes depositing an electrically conductive material layer on at least the electrical contact and walls of each hole in the photosensitive polymer layer. Note here, that the electrically conductive material layer can be deposited on the photosensitive polymer layer, as well as the electrical contact and walls of each hole in the photosensitive polymer layer so as to simplify the deposition process. The electrically conductive material has a melting point that is less than the temperature limit of the temperature sensitive material.

The method proceeds with removing the photosensitive polymer layer and excess portions of the electrically conductive material thereby leaving remaining portions of the electrically conductive material. Each remaining portion is electrically and mechanically connected to an electrical contact. The method further includes heating the remaining electrically conductive material above its melting point thereby forming electrically conducting volumes over the electrical contacts. Each electrically conducting volume is formed from the remaining portions of the electrically conductive material connected to the corresponding electrical contact.

Another embodiment of the present invention provides a method for interconnecting a first structure to a second structure. The first structure has a number of layers or regions and includes electrical contacts that are accessible via holes in a polymer layer, and a temperature sensitive material that has a temperature limit. The electrical contacts may be connected to the temperature sensitive material and/or to other parts included in the structure. The method includes depositing an electrically conductive material layer on at least the electrical contact and walls of each access hole. The electrically conductive material has a melting point that is less than the temperature limit of the temperature sensitive material.

The method further includes removing the polymer layer and excess portions of the electrically conductive material thereby leaving remaining portions of the electrically conductive material. Each remaining portion forms a saucer-like shape, where at least a portion of the saucer-like shape is electrically and mechanically connected to its corresponding electrical contact.

The method proceeds with heating remaining electrically conductive material above its melting point thereby forming electrically conducting volumes over the electrical contacts. Each electrically conducting volume is formed from the remaining portions of the electrically conductive material connected to the corresponding electrical contact. In alternative embodiments, the electrical contacts can be associated with an under-bump metallurgy layer to improve adhesion of the electrically conductive material. The method may further include aligning the electrically conducting volumes of the first structure with electrical contacts on the second structure, and then heating the conjoined assembly to a temperature sufficient to melt the electrically conducting volumes to form an electrical and mechanical bond between the structures.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The following figures illustrate a process for performing high-density interconnection of temperature sensitive devices in accordance with one embodiment of the present invention. Numerous variations and adaptations will be apparent in light of this disclosure, and the present invention is not intended to be limited to any one such embodiment. Note that the figures are not drawn to scale, and that depicted sizes (e.g., such as layer thicknesses) are greatly exaggerated for facilitating explanation and understanding. Cross-sectional views are generally denoted with an "a" while top views are denoted with a "b". General references can be made to a specific group of figures by referring the number associated with those figures. For example, general references to FIGS. 1a and 1b may be made with FIG. 1.

FIGS. 2a and 2b illustrate an application of a mask layer to the structure of FIG. 1.

FIGS. 3a and 3b illustrate an application of a first photopolymer layer to the structure of FIG. 2.

FIGS. 4a and 4b illustrate opening holes in the structure of FIG. 3 to reveal the mask layer.

FIGS. 5a and 5b illustrate the structure of FIG. 2 after etching the mask layer and removing the first photopolymer layer to reveal electrical connections on the substrate.

FIGS. 6a and 6b illustrate the structure of FIG. 5 after applying a second photopolymer layer, opening holes, depositing under-bump metallurgy and removing the second photopolymer layer.

FIGS. 7a and 7b illustrate the structure of FIG. 5 after applying additional photopolymer layers, opening holes, exposing the under-bump metallurgy and a portion of the mask layer.

FIGS. 8a and 8b illustrate deposition of electrically conductive material on the structure of FIG. 7.

FIGS. 9a and 9b illustrate the structure of FIG. 8 after removal of the additional photopolymer layers.

FIGS. 10a and 10b illustrate the structure of FIG. 9 after reflow of the electrically conductive material to form electrically conducting volumes.

DETAILED DESCRIPTION OF THE INVENTION

Embodiments of the present invention provide techniques for interconnecting large-area high-density electronic devices to other electronics, when temperature constraints prohibit the use of conventional reflow techniques. The techniques may also be employed when interconnecting smaller, less dense devices, since robust and reliable electrical connections are provided.

Figure 1A:
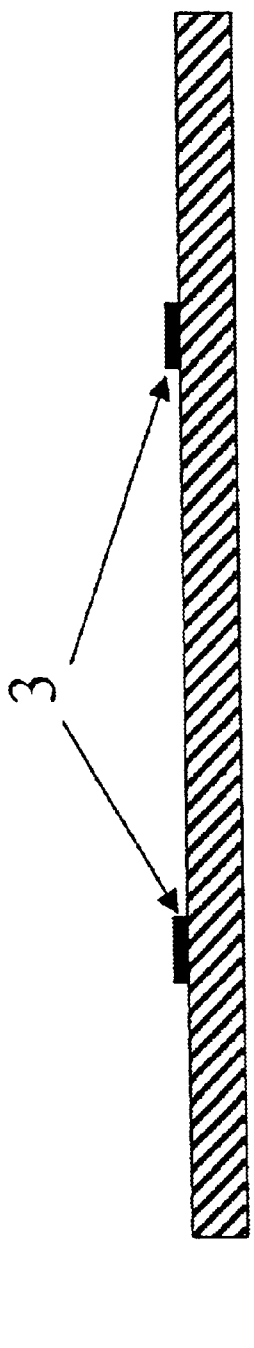
FIGS. 1a and 1b illustrate views of a structure including a temperature sensitive material and electrical connections.
Figure 1B:
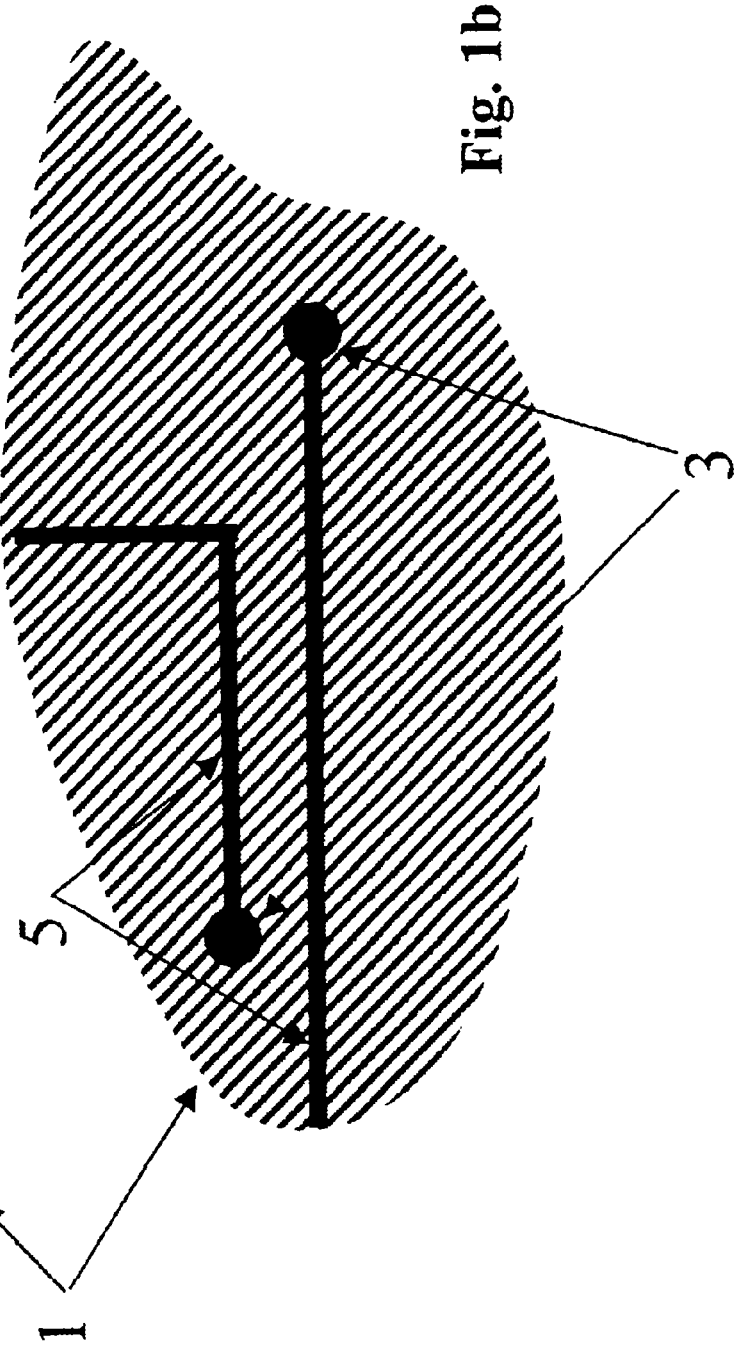

FIGS. 1a and 1b illustrate views of a structure including a temperature sensitive material and electrical connection points, some of which may be connections to the temperature sensitive material. In particular, FIGS. 1a and 1b are schematic diagrams, depicting cross-sectional and top views of a structure 1 which includes a temperature sensitive material, electrical connections 3, and electrical leads 5 from active elements (not shown) associated with the structure. Note that the thicknesses of the layers are greatly exaggerated for clarity.

The temperature sensitive material in structure 1 might be of the type employed, for example, in: piezoelectric devices such as acoustical/ultrasonic transducers (e.g., multi-element arrays), accelerometers or geophones; infrared detectors such as HgCdTe, InGaAs, InSb; micro-electromechanical systems (MEMS); detectors of organic molecules and/or gasses; and other semiconductor devices such as microprocessors and field-programmable gate arrays. Likewise, the temperature sensitive material might be a particular plastic or glass, such as that used in optical displays.

Generally stated, the electrical connections 3 of the structure can be connected to similar electrical connections on another integrated circuit (not shown) or component. Any portion or all of this processing can be done, for example, at the individual device level or the wafer level.

FIGS. 2a and 2b illustrate an application of a mask layer 7 to the structure of FIG. 1. In one example embodiment, this mask layer 7 (also called a solder mask layer or a non-adherent layer) is a thin film coating to which metals or other electrically conducting materials such as solder will not adhere.

Suitable mask layers 7 include, for instance, silicon dioxide, zinc sulfide (e.g., deposited by a low temperature vacuum deposition technique such as sputtering), organic coatings such as a photoresist or polyimide, and other coatings/layer to which metals will not adhere. Generally stated, the cure temperatures of such coatings/layers should be less than the maximum temperature limit associated with the temperature sensitive material of structure 1 to avoid damage.

FIGS. 3a and 3b illustrate an application of a first photopolymer layer to the structure of FIG. 2. In particular, a first photosensitive polymer layer 9, also known as photoresist, (e.g., such as P4620 manufactured by AZ Hoechst) is spun onto the mask layer 7 of the structure depicted in FIG. 2.

The process parameters for achieving this step will vary depending on factors such as the device being fabricated and the desired result. In one embodiment, the photosensitive polymer layer 9 is spun onto layer 7 of the structure at approximately 5000 RPM for 40 seconds. That structure is then baked, for example, on a hot plate for about 30 minutes.

FIGS. 4a and 4b illustrate opening holes in the structure of FIG. 3 to reveal the mask layer. Here, the first photopolymer layer 9 is exposed to ultraviolet light using a pattern or mask (not shown), which passes the ultraviolet light where holes in the polymer 9 are desired, and blocks the ultraviolet light where the polymer 9 is intended to remain. The structure is then baked in a vacuum for 1 hour, treated with ammonia in an oven, hydrated and flood exposed with ultraviolet light. The polymer 9 is then "developed," and holes 11 are thus opened thereby exposing the underlying mask 7.

FIGS. 5a and 5b illustrate the structure of FIG. 2 after etching the mask layer and removing the first photopolymer layer to reveal electrical connections on the temperature sensitive material. In this step, the area of mask layer 7 exposed (at holes 11 of FIG. 4) is etched away, leaving holes 13 thereby exposing the electrical contacts 3. Once the contacts 3 are exposed, the first photopolymer layer 9 (FIG. 4) is stripped off, leaving the structure of FIG. 5. Alternatively, the photopolymer layer 9 can be left on for use in subsequent processing steps.

Generally, the process steps illustrated in FIGS. 1 through 5 can be implemented with conventional photolithographic techniques. However, when applying photoresist to substrates (especially with a thick photoresist such as P4620), a thick bead of photoresist often forms at the edge of the device. Using a high spinning speed of the wafer when diffusing the photoresist can minimize this beading effect. Other techniques for removing such a bead include, for example, include exposing and developing the bead. However, such a technique eliminates the ability to define a pattern close to the edge of the device.

For example, one or more solder bump patterns may be defined within 100 μm of the edge of a device near the bead area. In such a case, a local application of developer along the bead area can be used so that the patterns in the interior portion of the wafer are not overdeveloped. Using this approach, solder bumps may be made very close to the edge of an individual device. Note that this approach is not necessary when patterning on devices on wafers.

FIGS. 6a and 6b illustrate the structure of FIG. 5 after applying a second photopolymer layer, opening holes, depositing under-bump metallurgy and removing the second photopolymer layer. This process is similar to that illustrated in FIGS. 3 and 4. Specifically, a layer of polymer is spun onto layer 7 of the structure, and the polymer is then exposed to light and developed, opening holes to expose electrical connections 3. Layers of different metals, known as the Under-Bump Metallurgy (UBM) layer, are deposited and the polymer is stripped off, leaving the UBM layer 14 adhered to the electrical connections 3.

UBM layers are metals to which electrically conducting materials such as metals or solder will easily wet and adhere. A UBM layer is ideally free of any oxide or contaminants prior to deposition of the electrically conducting material using vacuum thin film techniques. Such qualities will ensure a strong adhesion between the UBM layer and electrical connections 3, as well as between the UBM layer 14 and a subsequent metal or metal alloy layer.

In one embodiment, a UBM series of metal layers as follows is provided: Chromium, approximately 100 Angstroms in thickness to increase adhesion of the UBM to the device; Nickel, approximately 1200 Angstroms in thickness; and Gold, approximately 500 Angstroms in thickness. These layers are preferably deposited in sequence in the same vacuum chamber, without admitting oxygen to prevent growth of a Nickel oxide. An alternative to eliminate the Gold layer is to clean the Nickel with hydrogen in situ, prior to depositing an electrically conducting material layer 19 as will be discussed in reference to FIG. 8. Another way to avoid the Gold layer is to ion clean the Ni in situ prior to depositing layer 19.

FIGS. 7a and 7b illustrate the structure of FIG. 5 after applying additional photopolymer layers, opening holes, and exposing the under-bump metallurgy layer. In more detail, a third series of photopolymer layers 15 are applied, and additional holes 17 are opened up using the photolithography process previously described. In this particular embodiment, note that the holes 17 are larger than the previously opened holes 13. Thus, UBM layers 14 are exposed along with portions of the mask layer 7 surrounding the UBM layers 14.

Further note that, in this example, the layer of photopolymer layer 15 includes two applications of photopolymer thereby providing a sufficiently thick layer (e.g., >10 μm) for subsequent processes. Other embodiments may have additional photopolymer layers to provide a greater thickness to the overall photopolymer layer 15 as will be apparent in light of this disclosure, such as the forthcoming discussion associated with FIGS. 9 and 10.

FIGS. 8a and 8b illustrate deposition of electrically conductive material on the structure of FIG. 7. Here, a layer of electrically conducting material 19 is deposited onto the structure of FIG. 7 in a vacuum chamber. Note that a strong adhesion between the material 19 and the UBM layers 14 is formed. Generally, the choice of material 19 is dictated by the maximum temperature limit of the temperature sensitive material, assuming the material 19 also has the structural properties that the final structure requires.

In one embodiment, material 19 is a metal alloy whose melting temperature is slightly less (e.g., 5° to 50°) than the maximum temperature limit of the temperature sensitive material of structure 1. Deposition of material 19 may be assisted by an inert gas jet, which enables low deposition temperatures, as well as high deposition rates, which are cost effective techniques when depositing relatively thick layers (e.g., 10 to 30 μm). Other qualities that may affect the selection of material 19 will depend on factors such as the desired shear strength and cost.

Shear strength (e.g., measured in units of pounds/in$^2$ or psi) is a typical parameter considered in determining the reliability of an interconnection. Higher shear strengths result in connections that are more robust. The most widely used, common solder is a 90% Lead (Pb) 10% Tin (Sn) alloy with a melting point of 302° C. and a shear strength of 2400 psi. Another common solder is the eutectic alloy 63Sn37Pb with a 183° C. melting point and a 6200 psi shear strength.

Pure Indium (In), the material customarily used for infrared detector arrays, has a melting point of 157° C. and a shear strength (at room temperature) of 890 psi. In typical applications of infrared detector arrays, this low shear strength is not of importance, since at cryogenic temperatures the Indium becomes much harder and stronger. For applications at higher temperatures, Indium may not be a suitable material. Furthermore, the melting point of pure Indium may be above the temperature limit of the temperature sensitive material.

A typical ultrasound transducer array (e.g., a piezoelectric ceramic device) has a temperature limit of about 160° C. to 180° C. Heating such a device close to this temperature may degrade its performance. Similarly, heating it above this temperature may cause it to not function at all. Thus, the commonly used PbSn solders are not acceptable. For this application, an example alloy that can be deposited for the electrically conducting material layer 19 is 52% Indium: 48% Tin (In/Sn) that melts at 118° C. with a shear strength of 1630 psi.

Note that when depositing an alloy, the stoichiometry or ratio of metals in the alloy must be carefully preserved, or its thermal and mechanical properties will change. A change of a few percent can dramatically alter the melting temperature. Several deposition methods can be used that maintain stoichiometry. Examples include electroplating, sputtering and solder jetting. Deposition assisted by an inert gas jet (such as that developed by Jet Process Corporation, New Haven, Conn.) enables high deposition rates at low deposition temperatures.

FIGS. 9a and 9b illustrate the structure of FIG. 8 after removal of the third photopolymer layer. More specifically, the third polymer layers 15 and excess electrically conducting material 19 outside holes 17 are removed by a lift-off process, thereby leaving behind electrically conducting regions 20. In one embodiment, the lift-off process includes soaking the structure in a solvent such as acetone for dissolving the photopolymer layers 15, or otherwise breaking down the adhesion of the photopolymer layers 15 to the mask layer 7.

As the photopolymer layers 15 are removed, the excess electrically conducting material 19 is unsupported, and effectively breaks off. The portion of the electrically conducting material 19 remaining (designated as 20 in FIG. 9) is that which adheres to the UBM layers 14, and a surrounding region corresponding to holes 17. The strong adhesion between the electrically conducting material 19 and the UBM region 14 is unaffected by to the lift-off process.

The resulting shape of each electrically conducting region 20 is saucer-like, having a depression surrounded by a raised perimeter, although the height of this shape is greatly exaggerated in FIG. 9a. This saucer-like shape results due to a combination of factors including the dimensions of the holes 17 (e.g., including wall height and hole diameter) and the thickness of the photopolymer layers 15. The bottom portion of the depression (also referred to as a trough herein) of each electrically conducting region 20 adheres to its corresponding electrical contact 3 (or UBM region 14 when applied). Note that variations on the saucer-shape are possible as such factors are varied.

The exact shape of remaining material 20 may vary from this saucer-like description due to processing variables or methods. Regardless of its shape, each conducting region 20 is electrically and mechanically connected to an electrical contact 3 or UBM layer 14 when applied.

FIGS. 10a and 10b illustrate the structure of FIG. 9 after reflow of the electrically conductive material to form electrically conducting volumes. In particular, electrically conducting regions 20 of FIG. 9 are reflowed into semispherical shapes 21 to provide a height increase to facilitate subsequent processing. Generally, this height increase is a function of the volume of the remaining material 20 and the dimensions of the exposed contact 3 or UBM 14. Surface tension of the liquid material 19 forming each electrically conducting region 20 causes that region to assume the depicted semi-spherical shape.

Reflow of the electrically conducting material 19 can be accomplished in a variety of ways. In one embodiment, a no-clean liquid flux (e.g., such as NC771 manufactured by Indium Corporation of America) is applied to the surface of material 19 followed by heating the structure 5–10° C. above the melting temperature of material 19, followed by a quench in a solvent such as isopropanol to ensure that any residues from the reflow process are flushed away.

Reflow can also be accomplished by immersing the structure in a heated flux bath, followed by an immediate solvent rinse. This results in the solder gathering completely on top of the UBM layers 14, since the solder will not wet the solder mask layer 7.

Figure 11:
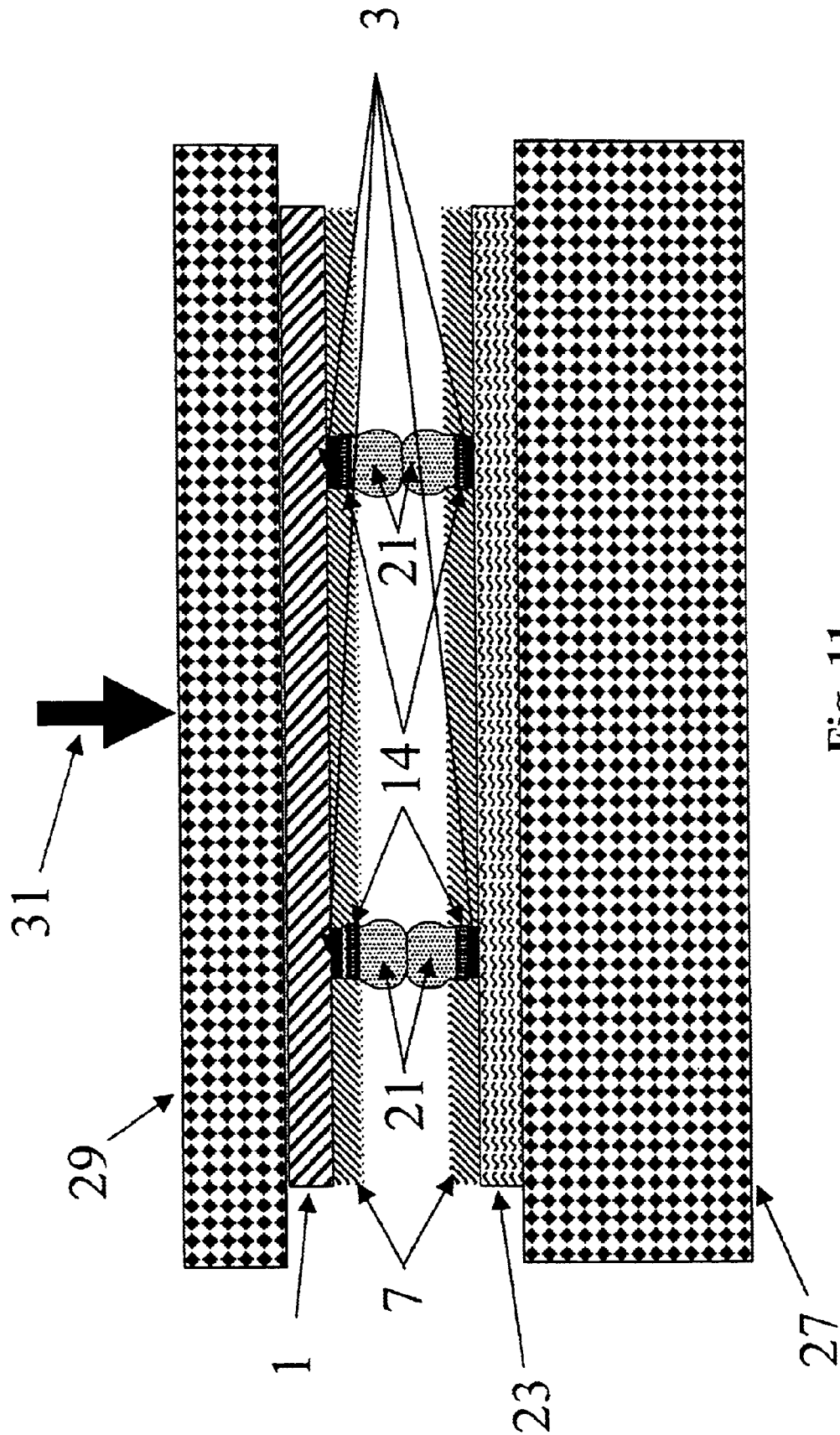
FIG. 11 illustrates the assembly of a first structure as illustrated in FIG. 10 to a second similarly processed structure by way of mechanically pressing respective electrically conducting volumes together.

FIG. 11 illustrates an assembly of a first structure as illustrated in FIG. 10 mated with a second structure by way of respectively aligned electrically conducting volumes. In this example embodiment, the process includes aligning and temporarily joining the structure 1 including temperature sensitive material and structure 23, which might be, for example, an integrated circuit or other assembly. Note that in this embodiment, structure 23 is prepared with semispherical volumes 21 in a similar manner as described in reference to FIGS. 1 through 10. In alternative embodiments, structure 23 may only have electrical contacts or it may have electrical contacts with an applied UBM.

Vacuum chucks 27 and 29 can be employed to hold the structure 1 and structure 23 without causing undesired deformation, as well as to establish accurate x and y alignment and parallelism between the structures to ensure contact of volumes 21. This can be accomplished, for example, with a chip aligner such as that made by Karl Süss, Basel, Germany, or Research Devices (Model M-8G), Princeton, N.J. These aligners have x-y placement accuracies better than 5 $\mu$m. In short, precise alignment tools are available for applications that require such accuracy.

With the structures aligned, a controlled force 31 is applied to the assembly. In one embodiment, this force 31 is about 5.0 to $10.0 \times 10^4$ g/cm$^2$, where the area (measured in centimeters in this case) is the cross-sectional area of all the volumes 21 included in the assembly. As will be appreciated, the force applied will vary depending on factors such as the type of material 19, the dimensions of volumes 21, the number of volumes 21, and the particular instrument employed to apply the force. The end result of applying the force is a conjoined structure including structure 23 and structure 1 with the temperature sensitive material.

Assume for one embodiment that material layer 19 is an Indium alloy, 52In:48Sn, as previously discussed. Such an alloy permits the two structures (IC 23 assembly and the structure 1 assembly) to be temporarily joined together, since the alloy is somewhat malleable at room temperature. This conjoining caused by force 31 also serves to fracture the surface oxide layer of the volumes 21 where they come into contact. This creates a metal-to-metal interface or temporary bond between the mating volumes 21, which facilitates subsequent processing.

Figure 12:
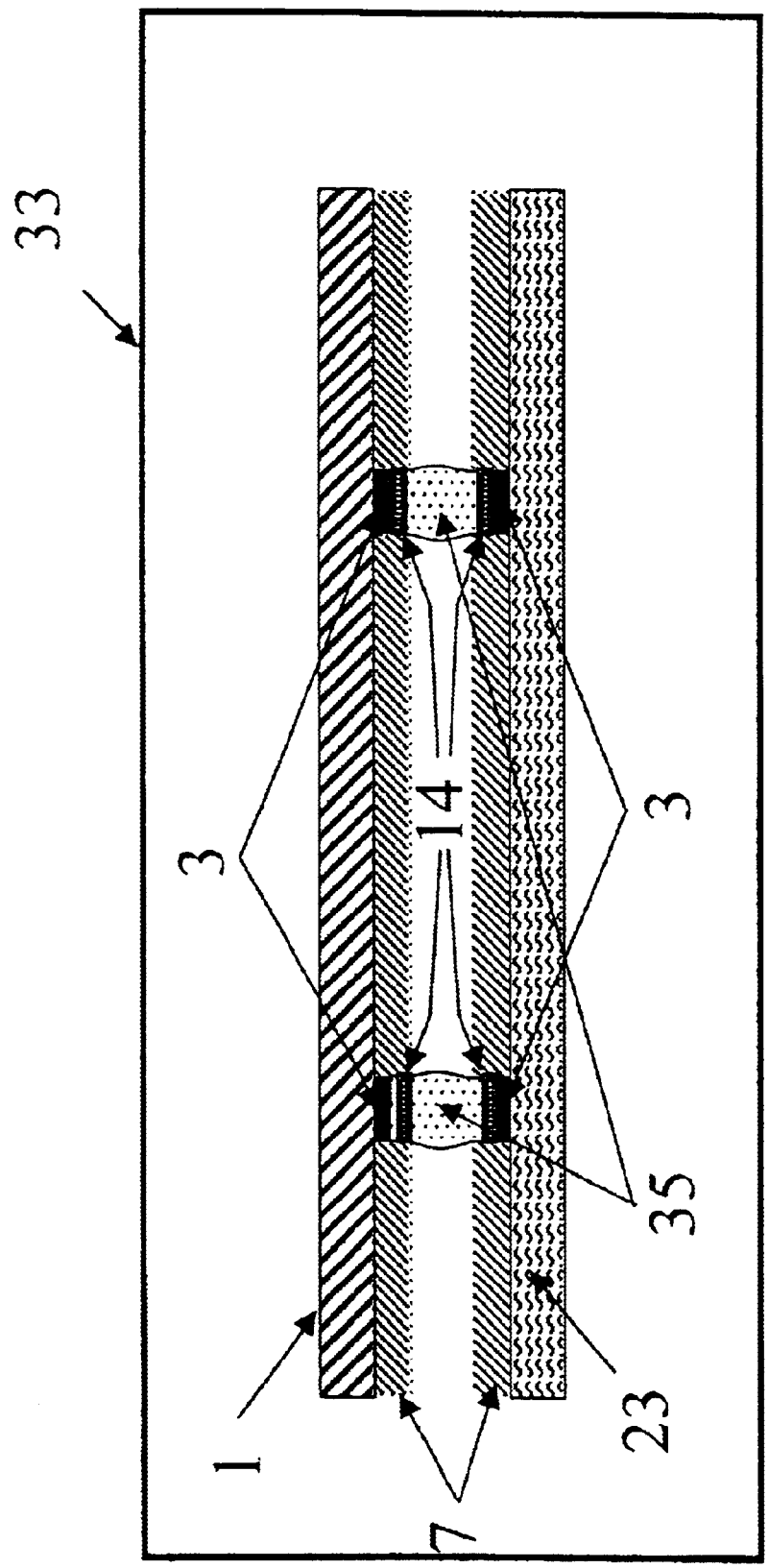
FIG. 12 illustrates heat-treating the assembly of FIG. 11 to reflow and fuse the respective electrically conducting volumes into a column.

FIG. 12 illustrates heat-treating the structure of FIG. 11 to reflow and fuse the respective electrically conducting volumes. More specifically, the forcibly joined volumes 21 are reflowed into electrically conducting columns 35 by heating-treating the assembly above the melting point of material 19 in oven 33. Assuming proper alignment, the columns 35 will form and provide the mechanical integrity required for a high reliability and robust interconnected assembly.

In one embodiment, the reflow of mating volumes 21 is accomplished by heating the assembly in a gaseous reducing atmosphere containing fluorine-based or other highly reactive atomic species. An example of a system for effecting such a gaseous solder reflow is made by Integrated Electronic Innovations, Inc. Note that this particular process also replaces the hard, high melting temperature oxide film on volumes 21 with a softer, more easily penetrable layer of oxyfluoride.

The foregoing description of the embodiments of the invention has been presented for the purposes of illustration and description. It is not intended to be exhaustive or to limit the invention to the precise form disclosed. Many modifications and variations are possible in light of this disclosure. For example, depositing a UBM region on the electrical contacts 3 improves adhesion strength to the material 19, but is not necessary, provided electrical contacts 3 already have a properly prepared surface. In addition, all the processes depicted in the figures need not be included to practice the invention. Further, the order in which processes or any sub-set of processes is implemented can vary. It is intended that the scope of the invention be limited not by this detailed description, but rather by the claims appended hereto.

What is claimed is:

1. A method for interconnecting a first structure to a second structure, the first structure including a photosensitive polymer layer, a mask layer, electrical contacts accessible via holes in the mask layer, and a temperature sensitive material that has an upper temperature limit, the method comprising:

etching the photosensitive polymer layer thereby opening a set of holes in the photosensitive polymer layer, each of these opened holes positioned over an electrical contact and wider than the corresponding hole in the mask layer;

depositing an electrically conductive material layer on at least the electrical contact and walls of each hole in the photosensitive polymer layer, the electrically conductive material having a melting point that is less than the temperature limit of the temperature sensitive material;

removing the photosensitive polymer layer and excess portions of the electrically conductive material thereby leaving remaining portions of the electrically conductive material, each remaining portion electrically and mechanically connected to an electrical contact; and heating remaining electrically conductive material above its melting point thereby forming electrically conducting volumes over the electrical contacts, each electrically conducting volume formed from the remaining portions of the electrically conductive material connected to the corresponding electrical contact.

2. The method of claim 1 wherein each electrical contact has an under-bump metallurgy (UBM) layer deposited thereon, and the electrically conductive material layer is deposited on the UBM layer and walls of each hole in the photosensitive polymer layer.

3. The method of claim 1 wherein each of the remaining portions of the electrically conductive material is electrically and mechanically connected to a UBM layer associated with each electrical contact.

4. The method of claim 1 further comprising:

aligning the electrically conducting volumes of the first structure with electrical contacts of the second structure; and forcibly pressing the aligned conducting volumes and electrical contacts together thereby forming a conjoined structure.

5. The method of claim 4 further comprising:

heating the conjoined structure to a temperature sufficient to reflow the aligned conducting volumes and electrical contacts to create electrically conducting columns between the first structure and the second structure.

6. The method of claim 5 wherein heating the conjoined structure is performed in a gaseous reducing atmosphere containing reactive atomic species.

7. The method of claim 1 wherein at least one of the first and second structures includes at least one of a piezoelectric device, an acoustical transducer, an ultrasonic transducer, an accelerometer, a geophone, an infrared detector, a microelectromechanical system, a chemical detector, a gas detector, an organic molecule detector, a microprocessor, a field-programmable gate array, a plastic, and a glass.

8. The method of claim 1 further including the preliminary steps of:

applying the mask layer to a structure including the temperature sensitive material, wherein electrically conducting materials will not adhere to the mask layer;

applying an initial photosensitive polymer layer to the mask layer;

exposing the initial photosensitive polymer layer to light in a pattern, the pattern corresponding to locations of the electrical contacts;

developing and etching the initial photosensitive polymer layer thereby opening holes in the initial photosensitive polymer layer over the mask layer;

etching the mask layer thereby opening the holes in the mask layer; and removing the initial photosensitive polymer layer.

9. The method of claim 1 wherein etching the photosensitive polymer layer thereby opening a set of holes in the photosensitive polymer layer includes the preliminary steps of:

applying the photosensitive polymer layer to the mask layer;

exposing the photosensitive polymer layer to light in a pattern, the pattern corresponding to locations the holes in the mask layer; and developing and etching the photosensitive polymer layer thereby opening the set of holes in the photosensitive polymer layer.

10. The method of claim 1 wherein depositing the electrically conductive material layer on the electrical contact and walls of each hole in the photosensitive polymer layer is accomplished via deposition assisted by an inert gas jet.

11. The method of claim 1 wherein the remaining portions of the electrically conductive material that are electrically and mechanically connected to the electrical contacts each has a volume that is determined by thickness of the polymer layer and dimensions of the holes in the photosensitive polymer layer.

12. The method of claim 1 wherein the temperature sensitive material is associated with one of a piezoelectric material or an infrared detector.

13. The method of claim 12 wherein the piezoelectric device is an ultrasonic transducer.

14. The method of claim 13 wherein the ultrasonic transducer is a multi-element array.

15. The method of claim 1 wherein the electrically conductive material is an alloy.

16. The method of claim 1 wherein the second structure has electrically conducting volumes that were formed by a process that is substantially similar the process used in forming the electrically conducting volumes of structure 1, method further comprising:

aligning the electrically conducting volumes of the first structure with electrically conducting volumes of the second structure;

forcibly pressing the aligned electrically conducting volumes together thereby forming a conjoined structure; and heating the conjoined structure to a temperature sufficient to reflow the aligned electrically conducting volumes to create electrically conducting columns between the first structure and the second structure.

17. The method of claim 1 wherein the remaining portions of the electrically conductive material form saucer-like shapes, wherein at least a portion of the saucer-like shape adheres to one of its corresponding electrical contact or a UBM layer on the corresponding electrical contact.

18. A method for interconnecting a first structure to a second structure, the first structure including a temperature sensitive material, a photosensitive polymer layer, a mask layer, and electrical contacts accessible via holes in the mask layer, where each electrical contact has an under-bump metallurgy (UBM) layer deposited thereon, the method comprising:

etching the photosensitive polymer layer thereby opening a set of holes in the photosensitive polymer layer, each of these opened holes over an electrical contact and wider than the corresponding hole in the mask layer;

depositing an electrically conductive material layer on at least the electrical contact UBM layer and walls of each hole in the photosensitive polymer layer, the electrically conductive material having a melting point that is less than a temperature limit of the temperature sensitive material;

removing the photosensitive polymer layer and excess portions of the electrically conductive material thereby leaving remaining portions of the electrically conductive material, each remaining portion forming a saucer-like shape, with at least a portion of the saucer-like shape electrically and mechanically connected to the corresponding electrical contact UBM layer; and heating remaining electrically conductive material above its melting point thereby forming electrically conducting volumes over the electrical contacts, each electrically conducting volume formed from the remaining portions of the electrically conductive material connected to the corresponding electrical contact.

19. A method for interconnecting a first structure to a second structure, the first structure including a polymer layer, a temperature sensitive material that has a temperature limit, and electrical contacts accessible via holes, the method comprising:

depositing an electrically conductive material layer on at least the electrical contact and walls of each access hole, the electrically conductive material having a melting point that is less than the temperature limit of the temperature sensitive material;

removing the polymer layer and excess portions of the electrically conductive material thereby leaving remaining portions of the electrically conductive material, each remaining portion forming a saucer-like shape, with at least a portion of the saucer-like shape electrically and mechanically connected to its corresponding electrical contact; and heating remaining electrically conductive material above its melting point thereby forming electrically conducting volumes over the electrical contacts, each electrically conducting volume formed from the remaining portions of the electrically conductive material connected to the corresponding electrical contact.

20. The method of claim 19 further comprising:

aligning the electrically conducting volumes of the first structure with electrical contacts of the second structure;

forcibly pressing the aligned electrically conducting volumes and electrical contacts together thereby forming a conjoined structure; and heating the conjoined structure to a temperature sufficient to reflow the aligned electrically conducting volumes and electrical contacts to create electrically conducting columns between the first structure and the second structure.

21. A method for interconnecting a first structure to a second structure, the first structure having a number of layers including a temperature sensitive material layer that has a temperature limit, electrical contacts, a photosensitive polymer layer, a mask layer with access to the electrical contacts via holes in the mask layer, wherein each electrical contact has an under-bump metallurgy (UBM) layer deposited thereon, the method comprising:

etching the photosensitive polymer layer thereby opening a set of holes in the photosensitive polymer layer, each of these opened holes positioned over an electrical contact and having a width greater than the corresponding hole in the mask layer;

depositing an electrically conductive material layer on at least one of the electrical contact UBM regions and walls of each hole in the photosensitive polymer layer, the electrically conductive material having a melting point that is less than the temperature limit of the temperature sensitive material;

removing the photosensitive polymer layer and excess portions of the electrically conductive material thereby leaving remaining portions of the electrically conductive material, each remaining portion forming a saucer-like shape, with at least a portion of the saucer-like shape electrically and mechanically connected to the corresponding electrical contact UBM layer;

heating remaining electrically conductive material above its melting point thereby forming electrically conducting volumes over the electrical contacts, each electrically conducting volume formed from the remaining portions of the electrically conductive material connected to the corresponding electrical contact;

aligning at least one of the electrically conducting volumes of the first structure with a corresponding electrical contact of the second structure;

forcibly pressing the aligned structures together thereby forming a conjoined structure; and heating the conjoined structure to a temperature sufficient to reflow the aligned electrically conducting volumes to create electrically conducting columns between the first structure and the second structure.

22. A method for interconnecting a first structure to a second structure, the first structure having at least one electrical contact and a temperature sensitive material that has a temperature limit, the first structure having been prepared by depositing a mask layer onto the temperature sensitive material, and depositing a first photosensitive polymer layer onto the mask layer, and exposing the first polymer layer to a pattern of light, and developing the first polymer layer to create at least one hole in the polymer layer such that the mask layer is exposed, and etching the mask layer to expose at least one electrical contact, and depositing an under-bump metallurgy on the electrical contact, and depositing one or more additional photosensitive polymer layers, and exposing the additional polymer layers to a pattern of light, and developing the additional polymer layers to create at least one hole in the polymer layer such that the under-bump metallurgy and a portion of the mask layer is exposed, and the second structure has active electronic circuits and at least one electrical contact, the method comprising:

depositing an electrically conductive material layer on at least one of the under-bump metallurgy contacts, the electrically conductive material having a melting point that is less than the temperature limit of the temperature sensitive material;

removing the polymer layer and excess portions of the electrically conductive material thereby leaving at least one remaining portion of the electrically conductive material, electrically and mechanically connected to its corresponding under-bump metallurgy;

heating remaining electrically conductive material above its melting point thereby forming electrically conducting volumes over the under-bump metallurgy, each electrically conducting volume formed from the remaining portions of the electrically conductive material and electrically and mechanically connected to the corresponding under-bump metallurgy;

forcibly contacting at least one electrically conducting volume of the first structure with at least one electrical contact of the second structure to form a conjoined assembly; and heating the assembly above the melting point of the electrically conducting material in an atmosphere containing reactive atomic species such that an electrical and mechanical interconnection is achieved between the first and second structures.

23. The method of claim 22 wherein at least one of the electrical contacts of the second structure is an electrically conducting volume formed in a like-manner to the electrically conducting volumes of the first structure.

* * * * *